(12) United States Patent
Zhang et al.

(10) Patent No.: US 12,422,577 B2
(45) Date of Patent: Sep. 23, 2025

(54) GAS DETECTOR FABRICATION METHOD, GAS DETECTOR, AND RAY DETECTION DEVICE

(71) Applicant: UNIVERSITY OF SCIENCE AND TECHNOLOGY OF CHINA, Anhui (CN)

(72) Inventors: Zhiyong Zhang, Anhui (CN); Changqing Feng, Anhui (CN); Sicheng Wen, Anhui (CN); Jianbei Liu, Anhui (CN); Ming Shao, Anhui (CN); Yi Zhou, Anhui (CN)

(73) Assignee: UNIVERSITY OF SCIENCE AND TECHNOLOGY OF CHINA, Hefei (CN)

( * ) Notice: Subject to any disclaimer, the term of this patent is extended or adjusted under 35 U.S.C. 154(b) by 156 days.

(21) Appl. No.: 18/569,599

(22) PCT Filed: Jul. 12, 2021

(86) PCT No.: PCT/CN2021/105756
§ 371 (c)(1),
(2) Date: Dec. 12, 2023

(87) PCT Pub. No.: WO2022/267105
PCT Pub. Date: Dec. 29, 2022

(65) Prior Publication Data
US 2024/0272316 A1    Aug. 15, 2024

(30) Foreign Application Priority Data
Jun. 25, 2021    (CN) .......................... 202110710500.4

(51) Int. Cl.
*G01T 1/185*    (2006.01)
*G01T 1/24*    (2006.01)
(Continued)

(52) U.S. Cl.
CPC ............ *G01T 1/2935* (2013.01); *G01T 1/185* (2013.01); *G01T 1/241* (2013.01); *H05K 1/0353* (2013.01); *H05K 1/095* (2013.01)

(58) Field of Classification Search
CPC ....... G01T 1/2935; G01T 1/185; G01T 1/241; H05K 1/0353; H05K 1/095
See application file for complete search history.

(56) References Cited

U.S. PATENT DOCUMENTS

2009/0202042 A1    8/2009   Jung
2019/0004185 A1    1/2019   Wang

FOREIGN PATENT DOCUMENTS

CN    101339251 A    1/2009
CN    101509977 A    8/2009
(Continued)

OTHER PUBLICATIONS

International Search Report, with English translation, and Written Opinion of International Searching Authority for Application No. PCT/CN2021/105756, mailed Mar. 22, 2022 (11 pages).
(Continued)

*Primary Examiner* — David P Porta
*Assistant Examiner* — Fani Polyzos Boosalis
(74) *Attorney, Agent, or Firm* — Nixon Peabody LLP

(57) ABSTRACT

A gas detector fabrication method is provided. The method includes: fabricating a signal readout plate: fabricating metal readout electrodes on an upper end surface of a lower insulating layer, and covering upper end surfaces of the metal readout electrodes with an upper insulating layer; pressing the signal readout plate and performing surface processing: pressing the signal readout plate on a substrate, and making a side, distant from the substrate, of the upper insulating layer to be a plane; fabricating a resistive anode electrode: fabricating a resistive layer on an upper end
(Continued)

surface of the signal readout plate, and fixing a low-resistance electrode ring to a periphery of an upper end surface of the resistive layer; and fabricating a detector amplification assembly: fixing a support frame to an upper end of the low-resistance electrode ring, and fixing a micro-grid electrode to an upper end of the support frame.

18 Claims, 4 Drawing Sheets

(51) Int. Cl.
    *G01T 1/29*     (2006.01)
    *H05K 1/03*     (2006.01)
    *H05K 1/09*     (2006.01)

(56) References Cited

FOREIGN PATENT DOCUMENTS

| CN | 103065920 A | 4/2013 | | |
|---|---|---|---|---|
| CN | 103308937 A | 9/2013 | | |
| CN | 104111471 A | 10/2014 | | |
| CN | 104793229 A | 7/2015 | | |
| CN | 104950323 A | 9/2015 | | |
| CN | 105005069 A | 10/2015 | | |
| CN | 109187663 A | 1/2019 | | |
| CN | 109444224 A | * | 3/2019 | ........... G01N 27/125 |
| CN | 110600358 A | 12/2019 | | |
| CN | 111239792 A | 6/2020 | | |
| CN | 111596341 A | 8/2020 | | |
| KR | 20140063729 A | * | 5/2014 | ............. G01T 1/185 |

OTHER PUBLICATIONS

State Intellectual Property Office of People's Republic of China; Office Action in related Chinese Patent Application No. 202110710500.4, dated May 27, 2022, with machine translation (14 pages).

* cited by examiner

GAS DETECTOR FABRICATION METHOD, GAS DETECTOR, AND RAY DETECTION DEVICE

CROSS REFERENCE TO RELATED APPLICATION

This application is a U.S. national stage application of International Patent Application No. PCT/CN2021/105756, filed on Jul. 12, 2021, which claims the benefit of and priority to Chinese Patent Application No. 202110710500.4, entitled "GAS DETECTOR FABRICATION METHOD, GAS DETECTOR, AND RAY DETECTION DEVICE," which was filed with the Chinese Patent Office on Jun. 25, 2021, each of which is hereby incorporated by reference herein in its entirety.

TECHNICAL FIELD

The present disclosure relates to the technical field of detection devices, in particular to a gas detector fabrication method, a gas detector and a ray detection device.

BACKGROUND

The low-radioactivity background particle detector (LBD) is widely used in the aspects of scientific research, nuclear energy application, environmental and food pollution detection. For example, in a scientific research experiment NEXT for searching rare cases, specially customized low background photomultiplier tubes (LBPMT) and silicon photomultiplier tubes (SiPM) are used for measuring particle energy and ion tracks. In environmental and food pollution detection, multi-wire proportional chambers, scintillator detectors and semiconductor detectors are adopted for measuring $\alpha$ and $\beta$ radioactivity of materials to be detected. However, in some specific application scenarios, the detector is required to be of both low-radioactivity background and high energy and position resolution capacity. For example, in a PandaX-III scientific experiment based on the principle of HP-TPC (High Pressure-Time Projection Chamber), it is planned to adopt Micro-bulk Micromegas fabricated by a micro-engraving method as an energy and track measurement detector.

Although existing $\alpha$-ray and $\beta$-ray detection devices can realize a low background through low-radioactivity materials, the processing technology is complicated due to the limitation of the texture and shape of the low-radioactivity materials, and the existing $\alpha$ ray and $\beta$ ray detection devices are low in resolution, so that detection for $\alpha$ rays and $\beta$ rays is difficult.

SUMMARY

The embodiments aim to provide a gas detector fabrication method, a gas detector and a ray detection device, so as to solve the problems in the prior art, and a ray particle detection with a low background and a high resolution can be realized.

In order to achieve the purpose, the present disclosure provides the following solution.

The present disclosure provides a gas detector fabrication method, including the following steps:
fabricating a signal readout plate, where the step of fabricating the signal readout plate includes fabricating metal readout electrodes on an upper end surface of a lower insulating layer, and covering upper end surfaces of the metal readout electrodes with an upper insulating layer;
pressing the signal readout plate and performing surface processing, where the step of pressing the signal readout plate and performing surface processing includes pressing the signal readout plate on a substrate, and making a side, distant from the substrate, of the upper insulating layer to be a plane;
fabricating a resistive anode electrode, where the step of fabricating the resistive anode electrode includes fabricating a resistive layer on an upper end surface of the signal readout plate, and fixing a low-resistance electrode ring to a periphery of an upper end surface of the resistive layer; and
fabricating a detector amplification assembly, where the step of fabricating the detector amplification assembly includes fixing a support frame to an upper end of the low-resistance electrode ring, making the support frame to completely cover the low-resistance electrode ring, and fixing a micro-grid electrode to an upper end of the support frame.

In some embodiments, in the step of fabricating the signal readout plate, the metal readout electrodes may be directly fabricated on the lower insulating layer with a nanofabrication method.

In some embodiments, in the step of pressing the signal readout plate and performing surface processing, an upper end surface of the substrate may be uniformly coated with a layer of epoxy resin glue, and the signal readout plate may be pasted on the upper end surface of the substrate and may be pressed, together with the substrate, by a flat press, and the upper end surface of the signal readout plate may be polished with sandpaper with a high number after the epoxy resin glue is cured to form the plane, and a surface roughness of the plane may be less than 1 micron.

The present disclosure further provides a gas detector, including a signal readout plate, a substrate, a resistive anode electrode and a detector amplification assembly. The detector amplification assembly, the resistive anode electrode, the substrate and the signal readout plate are sequentially stacked and fixed in a vertical direction, and the detector amplification assembly is located at an uppermost end. The detector amplification assembly includes a support frame and a micro-grid electrode, the support frame is fixed on an upper end surface of the resistive anode electrode, and the micro-grid electrode is fixed on an upper end surface of the support frame. The signal readout plate includes an upper insulating layer, metal readout electrodes and a lower insulating layer which are sequentially stacked from top to bottom, the metal readout electrodes are configured for forming a readout circuit, the upper insulating layer and the lower insulating layer are configured for isolating the metal readout electrodes from an outside, and a surface, distant from the substrate, of the upper insulating layer is a plane.

In some embodiments, each of the metal readout electrodes may be a PCB (Printed Circuit Board) copper-clad electrode or a nanofabrication coated electrode, and a thickness of the each of the metal readout electrodes may be not higher than 25 microns. The insulating layer may be a polyethylene film or a polyimide film, and a thickness of the insulating layer may be 25-500 microns.

In some embodiments, the substrate may be an oxygen-free copper plate, a thickness of the substrate may be 2-10 mm, and the signal readout plate may be fixed on an upper end surface of the substrate.

In some embodiments, the resistive anode electrode may include a low-resistance electrode ring and a resistive layer, the low-resistance electrode ring may be fixed on an upper end surface of the resistive layer and may be arranged near a circumferential edge of the resistive layer, and the resistive layer may be fixed on an upper end surface of the signal readout plate. The resistive layer may be a germanium film or a diamond-like carbon film. A periphery of the low-resistance electrode ring may be a silver-plated thin layer or a chromium-plated thin layer.

In some embodiments, the support frame may be made of PET (polyethylene terephthalate) material and may completely cover an upper end surface of the low-resistance electrode ring, and the micro-grid electrode may be made of metal material.

The present disclosure provides a ray detection device, including a shell, a field cage, a photoelectric detector and a gas detector according to any one of the above-mentioned technical solutions. A cathode electrode is arranged in the shell, a test cavity is formed in the shell, the field cage is located in the test cavity, an inside of the field cage communicates with the test cavity, and the field cage is configured for forming a uniform drift electric field. The photoelectric detector is fixed on an inner side wall of the shell and is located between an outer side wall of the field cage and the inner side wall of the shell, fluorescence generated by a sample in the test cavity is able to pass through a hollow portion of the field cage and is detected by the photoelectric detector, and the photoelectric detector is configured for measuring time zero of particle incidence in the sample. The gas detector is located on an inner bottom surface of the shell and is opposite to the cathode electrode, and the gas detector is configured for measuring time, a position and an amplitude of a particle ionization signal in the sample reaching the plane of the gas detector.

In some embodiments, the ray detection device may further include a support net and an organic film. A window may be formed in an upper end surface of the shell. A periphery of the support net may be fixed on an inner wall of the window. The support net may be configured for supporting the sample and allowing α rays and β rays in the sample to pass through. The organic film may be fixed at a lower end of the support net. The organic film may be fixed at an upper end of the cathode electrode.

Compared with the prior art, the embodiments have the following technical effects.

According to the gas detector fabrication method provided by the embodiments, the signal readout plate is pressed on the substrate. Because the signal readout plate is a thin flexible plate, the substrate with higher hardness can ensure the stability of the whole structure. The upper end surface of the signal readout plate is processed, and the side of the upper insulating layer distant from the substrate is a plane, so that the surface height difference caused by gaps in the metal readout electrode is reduced, the surface roughness of the signal readout plate is reduced, and the influence of the rough surface on spatial electric field distribution is avoided to realize high resolution of the gas detector. The micro-grid electrode and the support frame are made of materials with the low-radioactivity background to realize the low background of the gas detector, the support frame is fixed on the upper end of the low-resistance electrode ring and completely covers the low-resistance electrode ring, so that sparking between the micro-grid electrode and the low resistance electrode ring is prevented to affect the overall service life. Compared with the existing cascade or complex etching process of multi-layer GEM (Gas Electron Multi- plier) detectors, the gas detector fabrication method provided by the embodiments is simple in process, low in cost and high in reliability.

According to a gas detector provided by the embodiments, the detector amplification assembly includes a support frame and a micro-grid electrode. The support frame is fixed on the upper end surface of the resistive anode electrode. The resistive anode electrode can be covered to prevent sparking between the low-resistance electrode ring and the micro-grid electrode to affect the service life of the gas detector. The micro-grid electrode is fixed on the upper end surface of the support frame. The micro-grid electrode and the support frame are both made of materials with low-radioactivity background to realize the low background. The surface of the upper insulating layer distant from the substrate is a plane to reduce the surface height difference caused by gaps in the metal readout electrodes, so that the surface roughness of the signal readout plate is reduced, and the influence of the rough surface on the spatial electric field distribution is avoided to facilitate the high resolution of the gas detector.

According to a ray detection device provided by the embodiments, the electrode is arranged in the shell, and the test cavity is formed in the shell. The field cage is located in the test cavity, and the inside of the field cage communicates with the test cavity. The field cage is configured for forming the uniform drift electric field. Charged particles stimulate working gas in the drift electric field. The photoelectric detector is located between the outer side wall of the field cage and the inner side wall of the shell. Fluorescence generated by a sample in the test cavity can pass through the hollow portion of the field cage and is detected by the photoelectric detector, and the photoelectric detector measures fluorescence emission of working gas stimulated by the charged particles so as to determine the time zero. The gas detector is located on the inner bottom surface of the shell and opposite to the cathode electrode, and the arrival time and two-dimensional positions of ionized electrons are measured. In combination with time and position measurement, the three-dimensional track and the energy loss (dE/dx) information of the charged particles in the unit path are obtained. The detection efficiency of the gas detector for the charged particles is excellent, and the detection efficiency of the ray detection device is improved.

BRIEF DESCRIPTION OF THE DRAWINGS

To more clearly illustrate the present embodiment of the present disclosure or the technical solution in the prior art, the following briefly introduces the drawings to be used in the present embodiment. Apparently, the drawings in the following description show merely some embodiments of the present disclosure, and those skilled in the art may still derive other drawings from these drawings without creative efforts.

Reference signs: 100, ray detection device; 10, gas detector; 1, signal readout plate; 11, metal readout electrode; 12, insulating layer; 2, substrate; 3, resistive anode electrode; 31, low-resistance electrode ring; 32, resistive layer; 4, detector amplification assembly; 41, support frame; 42, micro-grid electrode; 20, shell; 30, photoelectric detector; 40, field cage; 50, sample; 60, incident window; 61, support frame; 62, organic film; 63, coated electrode; 64, hollow electrode; and 70, drift electrode.

DETAILED DESCRIPTION OF THE EMBODIMENTS

The following clearly and completely describes the technical solution in the embodiments of the present disclosure with reference to the embodiments of the present disclosure. Apparently, the described embodiments are merely a part rather than all of the embodiments of the present disclosure. Based on the embodiment in the present disclosure, all other embodiments obtained by the ordinary technical staff in the art under the premise of without contributing creative labor belong to the scope protected by the present disclosure.

The embodiments aim to provide a gas detector fabrication method, a gas detector and a ray detection device so as to solve the technical problem that an existing gas detector cannot realize the low background and high resolution and is complicated in process and high in production cost.

To make the above-mentioned purpose, the features and the advantages of the present disclosure clearer and more comprehensible, the present disclosure is further described in detail below with reference to the drawings and specific embodiments.

First Embodiment

The embodiment provides a gas detector 10 fabrication method, including the following steps.

Figure 1:
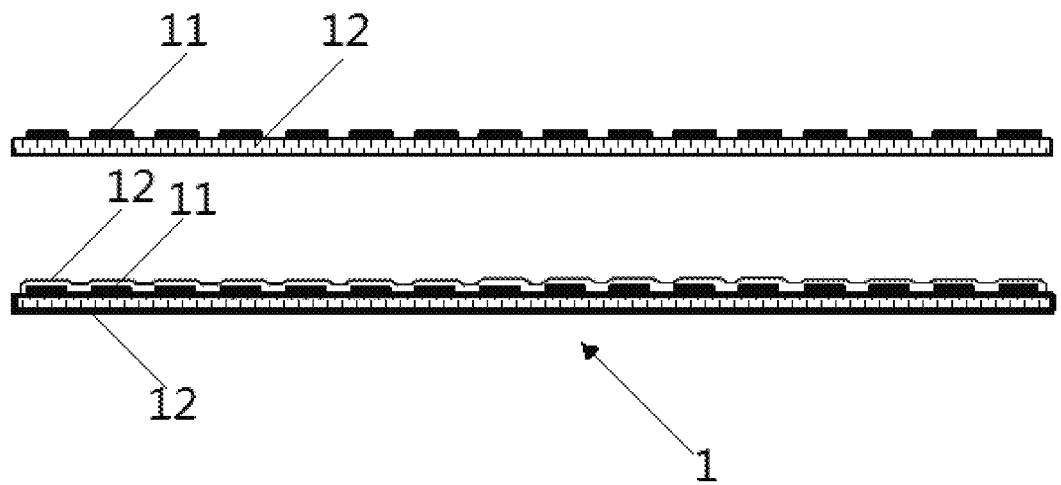
FIG. 1 is a schematic diagram of step S1 in a gas detector fabrication method provided by the first embodiment.
Figure 2:
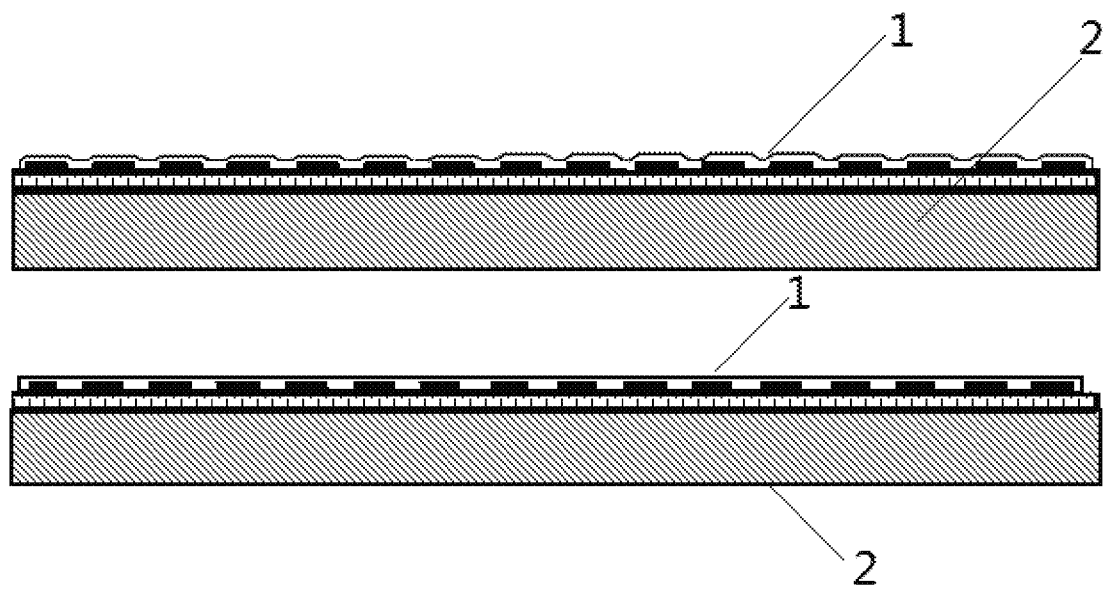
FIG. 2 is a schematic diagram of step S2 in a gas detector fabrication method provided by the first embodiment.
Figure 3:
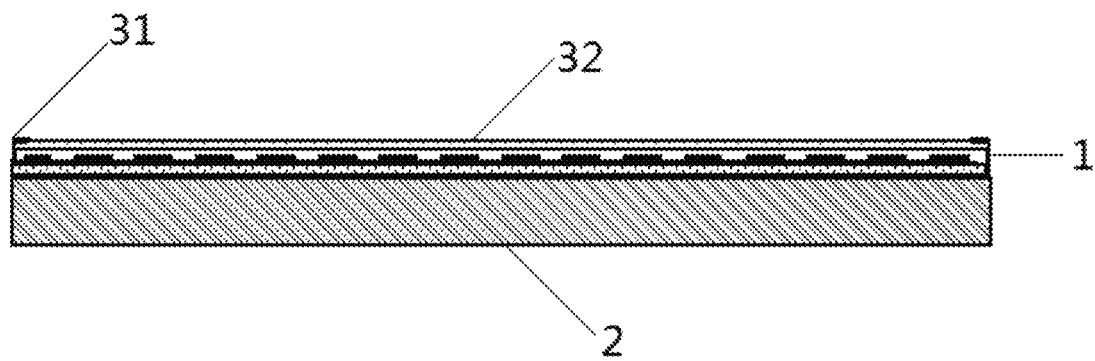
FIG. 3 is a schematic diagram of step S3 in a gas detector fabrication method provided by the first embodiment.
Figure 4:
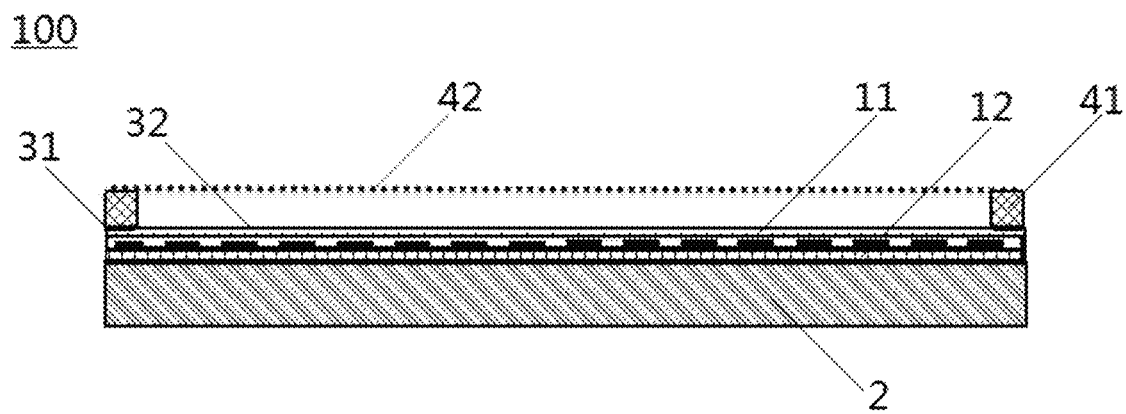
FIG. 4 is structural schematic diagram of a gas detector provided by the second embodiment.

In S1, as shown in FIG. 1, a signal readout plate 1 is fabricated, and a material with a low radioactive background is selected as insulating layers 12; preferably, the insulating layer 12 is a chemically purified organic film (such as polyethylenes and polyimides); metal readout electrodes 11 is fabricated on an upper end surface of a lower insulating layer 12, and this fabrication process can be directly realized by a flexible printed circuit board process; the metal readout electrode 11 is a PCB (Printed Circuit Board) copper-clad electrode or a nanofabrication coated electrode with a thickness of not higher than 25 microns; upper end surfaces of the metal readout electrodes 11 are covered with an upper insulating layer 12, the lower insulating layer 12 can be configured for isolating the metal readout electrodes 11 from a resistive anode electrode 3, so as to avoid from affecting the accuracy of a readout result and thus the resolution. If multi-layer staggered metal readout electrodes 11 are needed, the fabrication of a multi-layer staggered readout structure is directly completed by repeating step S1 or by a multi-layer flexible PCB process;

In S2, as shown in FIG. 2, the signal readout plate 1 is pressed and is performed surface processing, a high-purity oxygen-free copper plate with a thickness of 2-10 mm is selected as a substrate 2, an upper end surface of the substrate 2 is uniformly coated with a layer of epoxy resin glue, the signal readout plate 1 is pasted on the substrate 2 to realize fixed connection between the signal readout plate 1 and the substrate 2, and the structural stability of the signal readout plate 1 is improved; the signal readout plate is pressed, together with the substrate, by a flat press, so as to ensure a glue quantity as low as possible to avoid from affecting the measurement of the gas detector 10; gaps in an upper end surface of the signal readout plate 1 are filled with epoxy resin glue; and after the epoxy resin glue is cured, the surface of the signal readout plate 1 is polished with sandpaper with a high number (higher than 500 meshes) to reduce the surface height difference caused by gaps in the metal readout electrodes 11, so that the surface roughness is reduced to less than 1 micron, and the influence of rough surface on spatial electric field distribution is avoided to facilitate high resolution of the gas detector 10;

In S3, as shown in FIG. 3, a resistive anode electrode 3 is fabricated, a resistive layer 32 is fabricated on the surface of the signal readout plate 1 after processing in the S2; the resistive layer 32 is a high-purity germanium film fabricated by an electromagnetic or electron beam heating evaporation method, or a diamond-like carbon film fabricated by a high-purity graphite target magnetron sputtering method; the surface resistance is controlled in the range of 10 MΩ/□(MΩ/square) to 10 GΩ/□(GΩ/square); a low-resistance electrode strip or a low-resistance electrode ring 31 is made of metal coating such as silver or chromium at the periphery of the resistive layer 32; the width of the low-resistance electrode strip or the low-resistance electrode ring 31 is less than 1 mm; and the low-resistance electrode strip or the low-resistance electrode ring 31 is configured for terminating an anode potential of the gas detector 10;

In S4, as shown in FIG. 4, a detector amplification assembly 4 is fabricated, a PET base material with an extremely low radioactive background is selected as a support frame 41 for supporting a micro-grid electrode 42, and the width of the support frame 41 is 2-10 mm; the low-resistance strip or the low-resistance electrode ring 31 is completely covered, so as to prevent the gas detector 10 from sparking to affect the whole service life; and a metal (stainless steel or copper) woven micro-grid with extremely low radioactive background is selected as the micro-grid electrode 42, thereby facilitating to realize the gas detector with the low background.

Second Embodiment

As shown in FIG. 4, the embodiment provides a gas detector 10 fabricated by a gas detector fabrication method in the first embodiment. The gas detector 10 includes a signal readout plate 1, the substrate 2, the resistive anode electrode 3 and the detector amplification assembly 4. The detector amplification assembly 4, the resistive anode electrode 3, the substrate 2 and the signal readout plate 1 are sequentially stacked and fixed in the vertical direction, and the detector amplification assembly 4 is located at the uppermost end. The detector amplification assembly 4 includes the support frame 41 and the micro-grid electrode 42. The support frame 41 is fixed on an upper end surface of the resistive anode electrode 3, and the micro-grid electrode 42 is fixed on an upper end surface of the support frame 41. The resistive anode electrode 3 can be covered to prevent sparking between the low-resistance electrode ring 31 and the micro-grid electrode 42 to affect the service life of the gas detector 10. The micro-grid electrode 42 and the support frame 41 are both made of materials with low-radioactivity background. The fabrication method in the first embodiment is combined to facilitate the realization of the low background. The signal readout plate 1 includes two insulating layers 12 and a metal readout electrode 11. The upper insulating layer, the metal readout plate 12 and the lower insulating layer are sequentially stacked from top to bottom. The metal readout electrode is configured for forming a readout circuit. The upper insulating layer and the lower insulating layer are both configured for isolating the metal readout electrode from the outside. The surface, distant from the substrate, of the upper insulating layer 2 is a plane to reduce surface height difference caused by gaps in the metal readout electrodes 11, so that the surface roughness of the signal readout plate 1 is reduced, and then the influence of rough surface on spatial electric field distribution is avoided to facilitate high resolution of the gas detector 10.

Specifically, the insulating layers 12 are configured for isolating the metal readout electrode 11 from the resistive anode electrode 3.

The metal readout electrode 11 is a PCB copper-clad electrode or a nanofabrication coated electrode, and the thickness of the metal readout electrode 11 is not higher than 25 microns. The insulating layer 12 is a polyethylene film or a polyimide film, and the thickness of the insulating layer 12 is 25-500 microns.

The substrate 2 is an oxygen-free copper plate, and the thickness of the substrate is 2-10 mm. The signal readout plate 1 is fixed on an upper end surface of the substrate 2.

The resistive anode electrode 3 includes the low-resistance electrode ring 31 and the resistive layer 32. The low-resistance electrode ring 31 is fixed on an upper end surface of the resistive layer 32 and is arranged near a circumferential edge of the resistive layer 32. The resistive layer 32 is fixed on an upper end surface of the signal readout plate 1. The resistive layer 32 is a germanium film or a diamond-like carbon film. The low-resistance electrode ring 31 is a silver-plated thin layer or a chromium-plated thin layer.

The support frame 41 is made of PET material and completely covers an upper end surface of the low-resistance electrode ring 31, so that sparking between the low-resistance electrode ring 31 and the micro-grid electrode can be prevented to affect the service life of the whole structure. The micro-grid electrode 42 is made of metal material.

Third Embodiment

Figure 6:
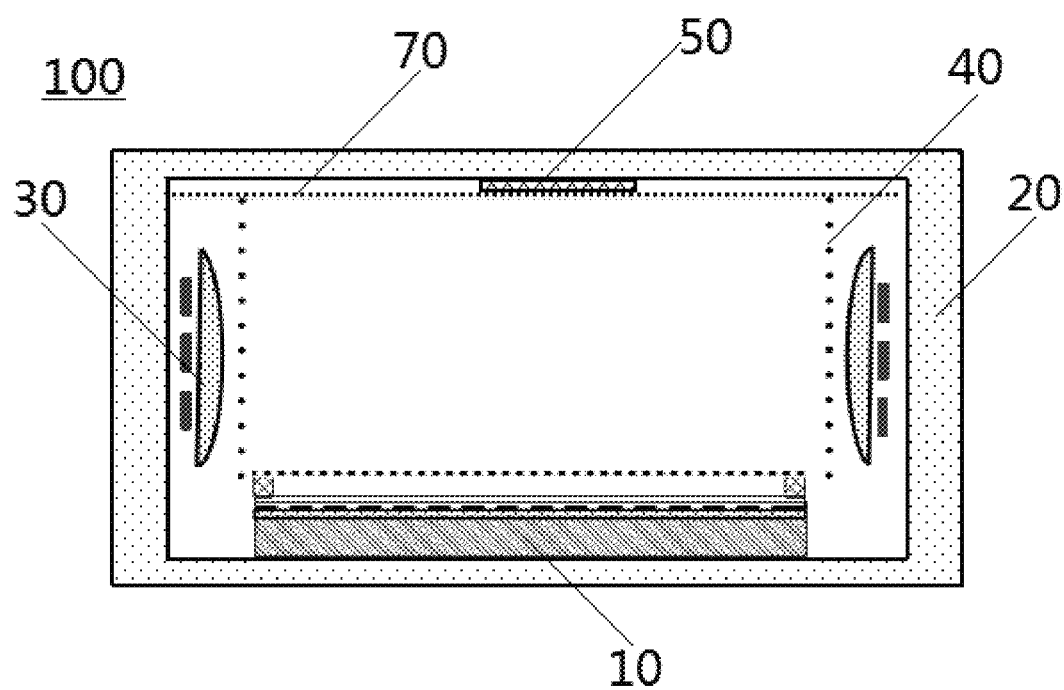
FIG. 6 is a structural schematic diagram of a windowless first ray detector in a ray detection device provided by the third embodiment.

As shown in FIG. 6, the embodiment provides a ray detection device 100, including a shell 20, a field cage 40, a photoelectric detector 30 and the gas detector 10 in the second embodiment. The shell 20 is a closed shell, and a windowless ray detection device 100 is formed. A cathode electrode 70 is arranged in the shell 20. A test cavity is formed in the shell 20 for ionizing particles in a sample 50. The field cage 40 is located in the test cavity, and the inside of the field cage 40 communicates with the test cavity. The field cage 40 is configured for forming a uniform drift electric field, so as to ensure ionization of the particles in the sample 50 to detect the particles. The photoelectric detector 30 is fixed on an inner side wall of the shell 20 and is located between an outer side wall of the field cage 40 and the inner side wall of the shell 20. Fluorescence generated by working gas stimulated by the sample 50 in the test cavity can pass through a hollow portion of the field cage 40 and is detected by the photoelectric detector 30. The photoelectric detector 30 is configured for measuring time zero of particle incidence in the sample 50, and reading out the arrival time and two-dimensional positions of ionized electrons in combination with given track drift speed. The gas detector 10 is located on an inner bottom surface of the shell 20 and is opposite to the sample 50. As a readout plane, the gas detector 10 has low-background and high-resolution particle detection capability, and can be configured for measuring the time, the position and the amplitude of a particle ionization signal in the sample 50 reaching the plane of the gas detector 10, and combined with time zero measurement, track measurement and energy measurement are realized, the absolute track information of particles is determined, and the radioactive background in the direction other than the sample 50 is excluded, so that absolute three-dimensional track and energy loss (dE/dx) information of charged particles in a unit path are obtained.

Moreover, due to significant differences in dE/dx, total energy deposition and initial position of different charged particles (such as α particle is charged to 2 and β particle is charged to 1), α particles and β particles can be easily distinguished and the environmental y background can be excluded. On the other hand, with the help of particle tracks and directions, it is easy to distinguish whether the signal is the sample to be measured or the environmental background, and further, the positions of α particles and the positions of and β particles and concentration distribution of the surface pollution of the sample can be further accurately imaged. Moreover, the method avoids large-volume and high-weight shielding materials, improves the flexibility of using the detection device, and greatly reduces the manufacturing cost. The gas detector 10 is excellent in detection efficiency for charged particles, and the detection efficiency is close to 100% corresponding to a drift area of above 1 cm and is far better than an existing technical solution.

Figure 5:
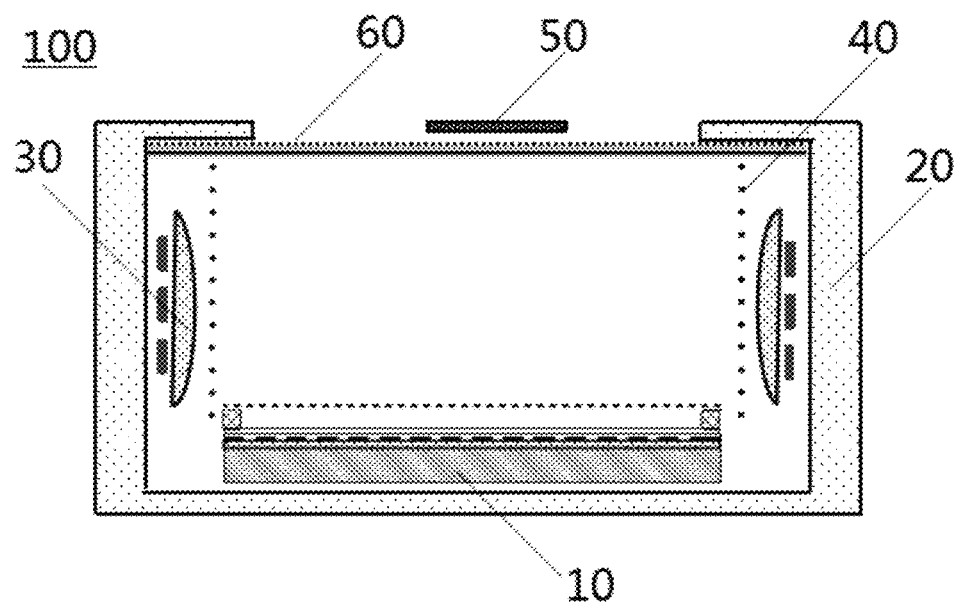
FIG. 5 is a structural schematic diagram of a windowed first ray detector in a ray detection device provided by the third embodiment.
Figure 7:
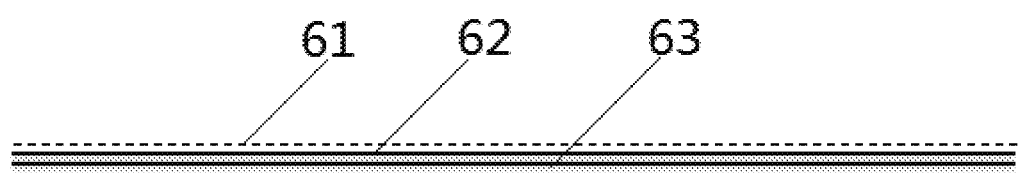
FIG. 7 is a structural schematic diagram of an incident window in a ray detection device provided by the third embodiment.
Figure 8:
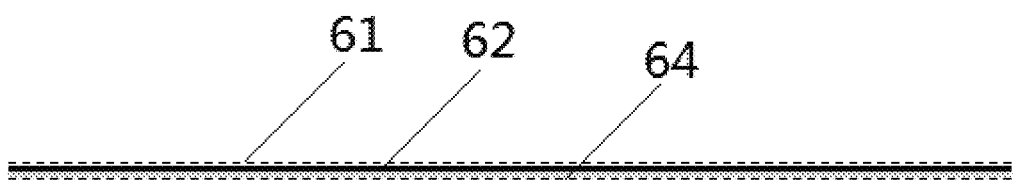
FIG. 8 is a structural schematic diagram of another windowed first ray detector in a ray detection device provided by the third embodiment.
Figure 9:
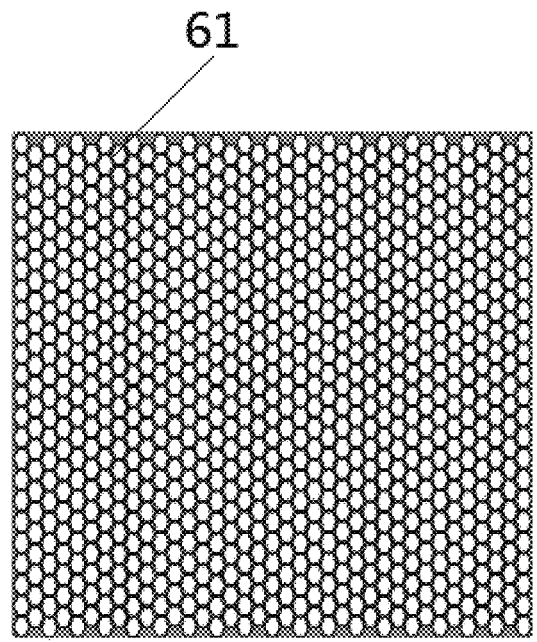
FIG. 9 is a structural schematic diagram of a support net in a ray detection device provided by the third embodiment.
Figure 10:
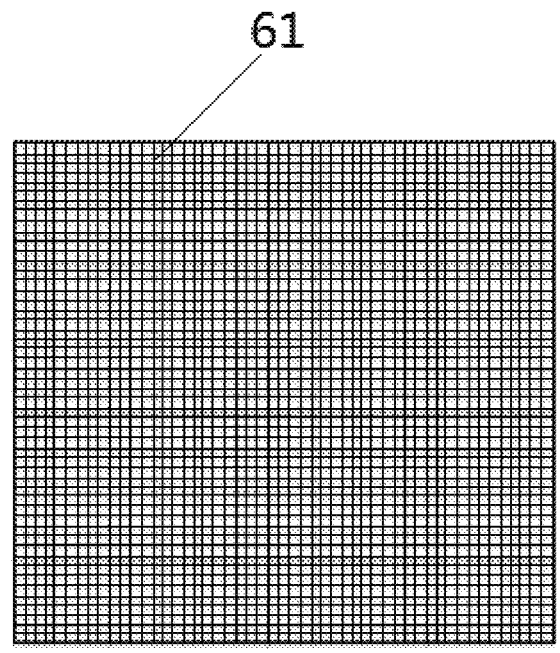
FIG. 10 is a structural schematic diagram of another support net in a ray detection device provided by the third embodiment.

As shown in FIG. 5, for a windowed ray detection device 100, a window is formed in an upper end surface of the shell 20, a support net 61, an organic film 62 and a cathode electrode form an incident window 60, the outer periphery of the support net 61 is fixed on an inner wall of the window, and the support net 61 is used for supporting the sample 50, so that the sample 50 is prevented from crushing the shell 20, and the α rays in the sample 50 and the β rays in the sample 50 can pass through the window 60 and reach the shell 20. Preferably, the support net 61 is a hollow skeleton, and the optical transmittance is not less than 60%. The organic film 62 is fixed at a lower end of the support net 61 and at an upper end of the cathode electrode 70. The organic film 62 is configured for sealing the shell 20 and allowing the α rays and the β rays to pass through. The cathode electrode 70 is configured as a cathode of the gas detector 10. Preferably, the thickness of the organic film 62 is 1 to 10 microns, and the organic film 62 is made of a polyester film or a polyimide material. The hollow skeleton is fabricated by metal film etching or laser cutting (as shown in FIG. 9) or woven with metal wires (as shown in FIG. 10), and the hollow mesh size is preferably 50-500 microns. The cathode electrode 70 is a coated electrode 63 (as shown in FIG. 7) or a hollow electrode 64 (as shown in FIG. 8). The coated electrode 63 is usually an aluminum film with a thickness of less than 500 nm. The material of the coated electrode 63 is not limited to aluminum, and the coated electrode 63 is a metal film or a conductive compound made of materials with a low atomic number and can be used as a drift cathode of the gas detector 10. The hollow electrode 64 has the same structural parameters as the hollow skeleton, and the meshes are aligned, so that the hollow electrode 64 can avoid from blocking the α rays and the β rays and avoid affecting the optical transmittance.

Specific examples are used for illustration of the principles and implementation methods of the present disclosure. The description of the above-mentioned embodiments is used to help illustrate the method and the core principles of the present disclosure; and meanwhile, those skilled in the art can make various modifications in terms of specific embodiments and scope of application in accordance with the teachings of the present disclosure. In conclusion, the content of this specification shall not be construed as a limitation to the present disclosure.

What is claimed is:

1. A gas detector fabrication method, comprising following steps:
    fabricating a signal readout plate, wherein the step of fabricating the signal readout plate comprises fabricating metal readout electrodes on an upper end surface of a lower insulating layer, and covering upper end surfaces of the metal readout electrodes with an upper insulating layer;
    pressing the signal readout plate and performing surface processing, wherein the step of pressing the signal readout plate and performing surface processing comprises pressing the signal readout plate on a substrate, and making a side, distant from the substrate, of the upper insulating layer to be a plane;
    fabricating a resistive anode electrodes, wherein the step of fabricating the resistive anode electrode comprises fabricating a resistive layer on an upper end surface of the signal readout plate, and fixing a low-resistance electrode ring to a periphery of an upper end surface of the resistive layer; and
    fabricating a detector amplification assembly, wherein the step of fabricating the detector amplification assembly comprises fixing a support frame to an upper end of the low-resistance electrode ring, making the support frame to completely cover the low-resistance electrode ring, and fixing a micro-grid electrode to an upper end of the support frame.

2. The gas detector fabrication method according to claim 1, wherein in the step of fabricating the signal readout plate, the metal readout electrodes are directly fabricated on the lower insulating layer with a nanofabrication method.

3. The gas detector fabrication method according to claim 1, wherein in the step of pressing the signal readout plate and performing surface processing, an upper end surface of the substrate is uniformly coated with a layer of epoxy resin glue, and the signal readout plate is pasted on the upper end surface of the substrate and is pressed, together with the substrate, by a flat press, and the upper end surface of the signal readout plate is polished with sandpaper with a high number after the epoxy resin glue is cured to form the plane, and a surface roughness of the plane is less than 1 micron.

4. A gas detector, comprising a signal readout plate, a substrate, a resistive anode electrode and a detector amplification assembly, wherein the detector amplification assembly, the resistive anode electrode, the substrate and the signal readout plate are sequentially stacked and fixed in a vertical direction, and the detector amplification assembly is located at an uppermost end; the detector amplification assembly comprises a support frame and a micro-grid electrode, the support frame is fixed on an upper end surface of the resistive anode electrode, and the micro-grid electrode is fixed on an upper end surface of the support frame; the signal readout plate comprises an upper insulating layer, metal readout electrodes and a lower insulating layer which are sequentially stacked from top to bottom, the metal readout electrodes are configured for forming a readout circuit, the upper insulating layer and the lower insulating layer are configured for isolating the metal readout electrodes from an outside, and a surface, distant from the substrate, of the upper insulating layer is a plane.

5. The gas detector according to claim 4, wherein each of the metal readout electrodes is a PCB (Printed Circuit Board) copper-clad electrode or a nanofabrication coated electrode, and a thickness of the each of the metal readout electrodes is not higher than 25 microns; and the insulating layer is a polyethylene film or a polyimide film, and a thickness of the insulating layer is 25-500 microns.

6. The gas detector according to claim 4, wherein the substrate is an oxygen-free copper plate, a thickness of the substrate is 2-10 mm, and the signal readout plate is fixed on an upper end surface of the substrate.

7. The gas detector according to claim 4, wherein the resistive anode electrode comprises a low-resistance electrode ring and a resistive layer, the low-resistance electrode ring is fixed on an upper end surface of the resistive layer and is arranged near a circumferential edge of the resistive layer, and the resistive layer is fixed on an upper end surface of the signal readout plate; the resistive layer is a germanium film or a diamond-like carbon film; and a periphery of the low-resistance electrode ring is a silver-plated thin layer or a chromium-plated thin layer.

8. The gas detector according to claim 7, wherein the support frame is made of PET (polyethylene terephthalate) material and completely covers an upper end surface of the low-resistance electrode ring, and the micro-grid electrode is made of metal material.

9. A ray detection device, comprising a shell, a field cage, a photoelectric detector and a gas detector,
    wherein the gas detector comprises a signal readout plate, a substrate, a resistive anode electrode and a detector amplification assembly, the detector amplification assembly, the resistive anode electrode, the substrate and the signal readout plate are sequentially stacked and fixed in a vertical direction, and the detector amplification assembly is located at an uppermost end; the detector amplification assembly comprises a support frame and a micro-grid electrode, the support frame is fixed on an upper end surface of the resistive anode electrode, and the micro-grid electrode is fixed on an upper end surface of the support frame; the signal readout plate comprises an upper insulating layer, metal readout electrodes and a lower insulating layer which are sequentially stacked from top to bottom, the metal readout electrodes are configured for forming a readout circuit, the upper insulating layer and the lower insulating layer are configured for isolating the metal readout electrodes from an outside, and a surface, distant from the substrate, of the upper insulating layer is a plane; and
    wherein a cathode electrode is arranged in the shell, a test cavity is formed in the shell, the field cage is located in the test cavity, an inside of the field cage communicates with the test cavity, and the field cage is configured for forming a uniform drift electric field; the photoelectric detector is fixed on an inner side wall of the shell and is located between an outer side wall of the field cage and the inner side wall of the shell, fluorescence generated by a sample in the test cavity is able to pass through a hollow portion of the field cage and is detected by the photoelectric detector, and the photoelectric detector is configured for measuring time zero of particle incidence in the sample; and the gas detector is located on an inner bottom surface of the shell and is opposite to the cathode electrode, and the gas detector is configured for measuring time, a position and an amplitude of a particle ionization signal in the sample reaching the plane of the gas detector.

10. The ray detection device according to claim 9, further comprising a support net and an organic film, wherein a window is formed in an upper end surface of the shell, a periphery of the support net is fixed on an inner wall of the window, the support net is configured for supporting the sample and allowing $\alpha$ rays and $\beta$ rays in the sample to pass through, the organic film is fixed at a lower end of the support net, and the organic film is fixed at an upper end of the cathode electrode.

11. The ray detection device according to claim 10, wherein each of the metal readout electrodes is a PCB (Printed Circuit Board) copper-clad electrode or a nanofabrication coated electrode, and a thickness of the each of the metal readout electrodes is not higher than 25 microns; and the insulating layer is a polyethylene film or a polyimide film, and a thickness of the insulating layer is 25-500 microns.

12. The ray detection device according to claim 10, wherein the substrate is an oxygen-free copper plate, a thickness of the substrate is 2-10 mm, and the signal readout plate is fixed on an upper end surface of the substrate.

13. The ray detection device according to claim 10, wherein the resistive anode electrode comprises a low-resistance electrode ring and a resistive layer, the low-resistance electrode ring is fixed on an upper end surface of the resistive layer and is arranged near a circumferential edge of the resistive layer, and the resistive layer is fixed on an upper end surface of the signal readout plate; the resistive layer is a germanium film or a diamond-like carbon film; and a periphery of the low-resistance electrode ring is a silver-plated thin layer or a chromium-plated thin layer.

14. The ray detection device according to claim 13, wherein the support frame is made of PET (polyethylene terephthalate) material and completely covers an upper end surface of the low-resistance electrode ring, and the micro-grid electrode is made of metal material.

15. The ray detection device according to claim 9, wherein each of the metal readout electrodes is a PCB (Printed Circuit Board) copper-clad electrode or a nanofabrication coated electrode, and a thickness of the each of the metal readout electrodes is not higher than 25 microns; and the insulating layer is a polyethylene film or a polyimide film, and a thickness of the insulating layer is 25-500 microns.

16. The ray detection device according to claim 9, wherein the substrate is an oxygen-free copper plate, a thickness of the substrate is 2-10 mm, and the signal readout plate is fixed on an upper end surface of the substrate.

17. The ray detection device according to claim 9, wherein the resistive anode electrode comprises a low-resistance electrode ring and a resistive layer, the low-resistance electrode ring is fixed on an upper end surface of the resistive layer and is arranged near a circumferential edge of the resistive layer, and the resistive layer is fixed on an upper end surface of the signal readout plate; the resistive layer is a germanium film or a diamond-like carbon film; and a periphery of the low-resistance electrode ring is a silver-plated thin layer or a chromium-plated thin layer.

18. The ray detection device according to claim 17, wherein the support frame is made of PET (polyethylene terephthalate) material and completely covers an upper end surface of the low-resistance electrode ring, and the micro-grid electrode is made of metal material.

* * * * *